US006925010B2

(12) United States Patent
Houston

(10) Patent No.: US 6,925,010 B2
(45) Date of Patent: Aug. 2, 2005

(54) STATIC RANDOM ACCESS MEMORY DEVICE HAVING DECREASED SENSITIVITY TO VARIATIONS IN CHANNEL PHYSICAL CHARACTERISTICS

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 199 days.

(21) Appl. No.: 10/616,755

(22) Filed: Jul. 10, 2003

(65) Prior Publication Data

US 2005/0007831 A1 Jan. 13, 2005

(51) Int. Cl.⁷ ................................................ G11C 7/00
(52) U.S. Cl. ........................... 365/185.27; 365/185.24; 365/185.18; 365/185.02; 365/226
(58) Field of Search ....................... 365/185.27, 185.18, 365/185.24, 185.02, 226

(56) References Cited

U.S. PATENT DOCUMENTS

| | | | | |
|---|---|---|---|---|
| 4,958,316 A | | 9/1990 | Ochii et al. | |
| 5,432,356 A | * | 7/1995 | Imamura | 257/24 |
| 5,526,313 A | * | 6/1996 | Etoh et al. | 365/205 |
| 5,592,013 A | * | 1/1997 | Honda | 257/392 |
| 5,706,226 A | | 1/1998 | Chan et al. | |
| 5,757,702 A | * | 5/1998 | Iwata et al. | 365/189.05 |
| 6,044,011 A | * | 3/2000 | Marr et al. | 365/154 |
| 6,108,233 A | | 8/2000 | Lee et al. | |
| 6,172,899 B1 | * | 1/2001 | Marr et al. | 365/154 |
| 6,194,945 B1 | | 2/2001 | Bahramzadeh | |
| 6,301,146 B1 | | 10/2001 | Ang et al. | |
| 6,466,489 B1 | * | 10/2002 | Ieong et al. | 365/189.09 |
| 6,690,039 B1 | * | 2/2004 | Nemati et al. | 257/133 |
| 6,809,968 B2 | * | 10/2004 | Marr et al. | 365/185.24 |

* cited by examiner

Primary Examiner—Viet Q. Nguyen
(74) Attorney, Agent, or Firm—Jacqueline J. Garner; Wade James Brady, III; Frederick J. Telecky, Jr.

(57) ABSTRACT

A static random access memory (SRAM) device and a method of manufacturing the same. In one embodiment, the SRAM device includes: (1) a first bias voltage contact biasable to a first potential, (2) a second bias voltage contact biasable to a second potential that differs from the first potential and (3) a well having channels formed therein and connected to one of said first and second bias voltage contacts based on a transistor characteristic of said SRAM device that bears on static noise margin (SNM) and write trip voltage $V_{trip}$.

19 Claims, 3 Drawing Sheets

STATIC RANDOM ACCESS MEMORY DEVICE HAVING DECREASED SENSITIVITY TO VARIATIONS IN CHANNEL PHYSICAL CHARACTERISTICS

TECHNICAL FIELD OF THE INVENTION

The present invention is directed, in general, to static random access memory (SRAM) devices and, more specifically, to an SRAM device having decreased sensitivity to variations in transistor characteristics.

BACKGROUND OF THE INVENTION

Memory devices are well known in the art and used in, among other things, virtually all microprocessor and digital signal processor applications. One type of memory favored for many applications is Static Random Access Memory (SRAM). SRAM devices are fast and easy to use relative to many other types of memory devices. In addition, SRAM devices using metal-oxide-semiconductor (MOS) technology exhibit relatively low standby power and do not require a refresh cycle to maintain stored information. These attributes make SRAM devices particularly desirable for battery-powered equipment, such as laptop computers and personal digital assistants.

A high static noise margin (SNM) and write trip voltage (so-called "$V_{trip}$") are desired cell characteristics of a SRAM device. A high SNM is desired for circuit stability. If SNM is too low, READ operations may be disrupted. A high $V_{trip}$ is desired for adequate data write speed. If $V_{trip}$ is too low, WRITE operations may be disrupted. Unfortunately, the requirements for acceptable SNM and $V_{trip}$ limit the tolerances for acceptable SRAM yield during manufacturing, because increasing one typically decreases the other, as described below.

A typical six-transistor SRAM memory cell (the basic unit of a SRAM device) consists of two p-channel "pull-up" transistors, two n-channel "pull-down" transistors and two access transistors, which are typically n-channel transistors. The strength of the p-doped and n-doped channels of the transistors affects the performance of the SRAM memory cell as a whole.

For example, a strong n-channel can cause SNM to be unsuitably low, particularly when accompanied by a weak p-channel. One might be tempted to weaken the n-channel and/or strengthen the p-channel to achieve a satisfactory SNM. However, a weak n-channel can cause $V_{trip}$ to be unsuitably low, particularly when accompanied by a strong p-channel.

Thus, existing SRAM devices are challenged by the competing and contradicting objectives of providing a weak n-channel (and/or a strong p-channel) to achieve an acceptable SNM and providing a strong n-channel (and/or a weak p-channel) to achieve an acceptable $V_{trip}$. Moreover, this trade-off between SNM and $V_{trip}$ (and, thus, between reliable READ and WRITE operations) becomes increasingly constrained with continued miniaturization and lower operating voltages, since these amplify the effect of normal manufacturing variations. The result is that manufacturing yield has been diminishing, raising the cost of the devices that are successfully manufactured.

Accordingly, what is needed in the art is an SRAM device having improved worst-case SNM and $V_{trip}$ over a range of transistor characteristics. What is further needed in the art is a way to increase SRAM yield.

SUMMARY OF THE INVENTION

To address the above-discussed deficiencies of the prior art, the present invention provides an SRAM device and a method of manufacturing the same. In one embodiment, the SRAM device includes: (1) a first bias voltage contact biasable to a first potential, (2) a second bias voltage contact biasable to a second potential that differs from the first potential and (3) a well having channels formed therein and connected to one of the first and second bias voltage contacts based on transistor characteristics of the SRAM device that bear on SNM and $V_{trip}$.

The present invention therefore introduces an SRAM device in which channels can be provided a bias voltage that has been selected to allow them to operate in a desired manner when SNM and $V_{trip}$ might otherwise prohibit were the bias voltage to be unselectable.

The present invention is distinguished from existing devices in which a back-gate-bias is continually adjusted during operation of the device. Such configurations are frequently, if not necessarily, accompanied by latency problems due to switching speed. In contrast, the well is selectively biased during an initial calibration procedure, such that it remains biased by an enduring potential throughout operation.

In one embodiment of the present invention, a fuse circuit connects the well to the sources of first or second potential. The fuse circuit is configured to: (1) connect the well to the source of first potential when the fuse circuit is conductive, and (2) connect the well to the source of second potential when the fuse circuit is non-conductive.

In an alternative embodiment, a conductor or a bond pad connects the well to the sources of first or second potential. The conductor or bond pad may be formed in the device or interconnect layers. The term "bond pad" is generic; it includes solder bumps and other external connection structures.

In another alternative embodiment, a switch connects the well to the sources of first or second potential. The switch may be operated by the system in which the device is implemented, perhaps by way of read-only memory (ROM) register contents. Alternatively, the system may examine the SNM and $V_{trip}$ of the memory array to determine which of the sources of first and second potential should be connected to the well.

In one embodiment of the present invention, the first potential is a chip supply voltage. Employing the device power supply is a convenient, because the device power supply is a readily available potential source in existing SRAM devices, meaning that no additional potential source is required to implement the present invention. Similarly, in one embodiment, the second potential is an input/output buffer supply voltage, which is also a readily available potential source in existing SRAM devices. Of course, other sources may be accessed to bias the well via one of the sources of first and second potential. In another embodiment, more than two potentials may be available for biasing the well.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
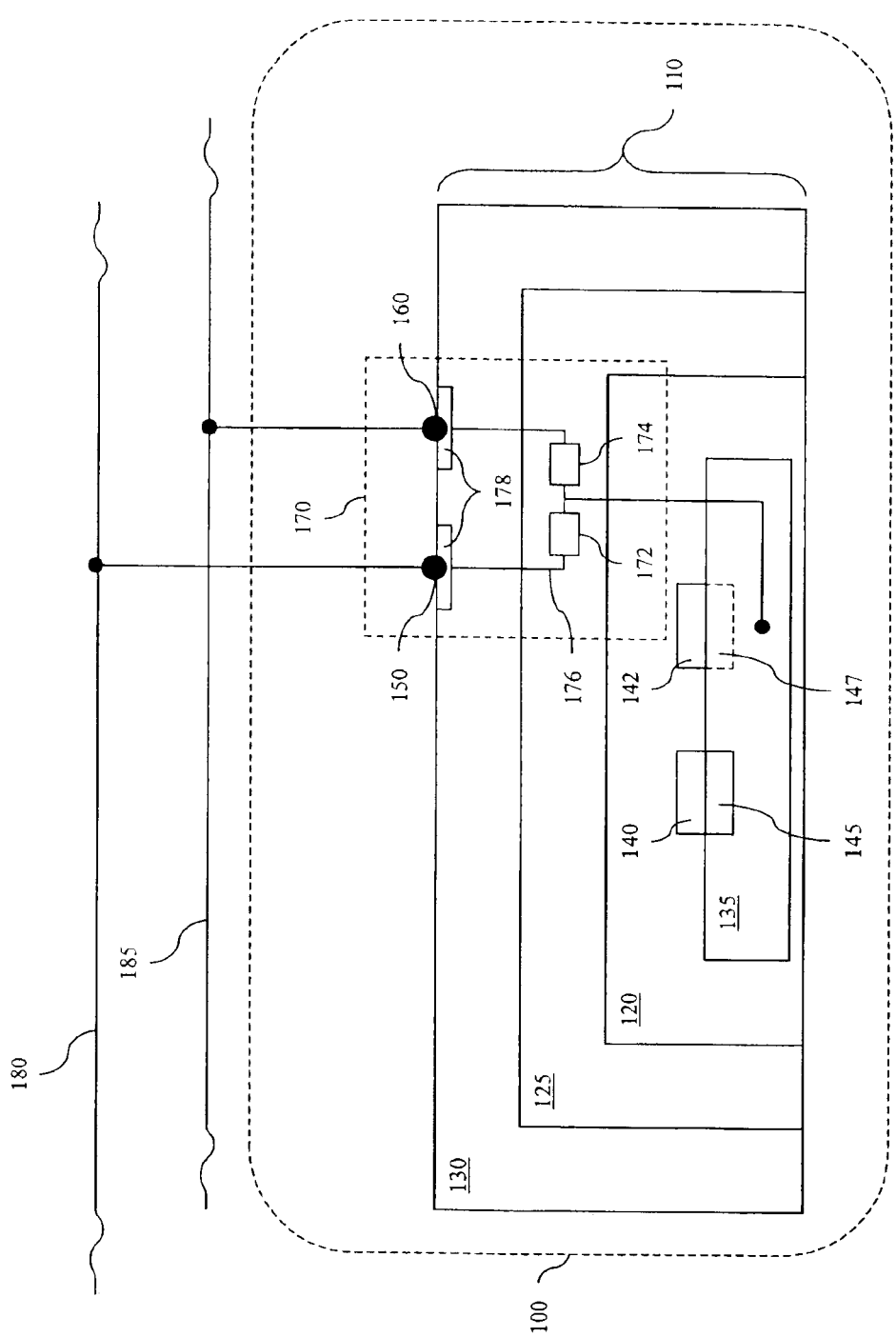
FIG. 1 illustrates a highly schematic diagram of one embodiment of an SPAM device constructed according to the principles of the present invention.

Referring initially to FIG. 1, illustrated is a highly schematic diagram of an embodiment of an integrated circuit (IC) 100 containing a SRAM device constructed according to the principles of the present invention. The IC 100 is a conventional structure for semiconductor devices.

The IC 100 has a substrate 110 in or on which is located a device layer 120. The device layer 120 refers to that portion of the substrate in which device regions (e.g., channels) are implanted or the layer(s) over the substrate in which such regions are formed. Thus, the device layer 120 contains the devices that constitute the IC 100. An interconnect layer 125 is located over the device layer 120, and a package 130 at least partially encapsulates the device layer 120 and interconnect layer 125.

The device layer 120 includes a well 135, first and second gates 140, 142 formed thereover, a first channel 145 formed under the first gate 140 and a second channel 147 formed under the second gate 142 and comprising a portion of the well 135.

The device layer 120 may include myriad other features and thereby multiple devices. For example, the device layer 120 may include features forming an array of SRAM devices 100. While FIG. 1 does not illustrate these other features and devices, those skilled in the art understand that the illustrated embodiment represents an exemplary cell in a memory cell array.

In one embodiment, the well 135 (and, hence, the second channel 147) includes a first dopant type and the first channel 145 includes a second dopant type that is opposite the first dopant type. For example, the first channel 145 may be a p-channel and the second channel 147 may be an n-channel. However, the present invention is not limited to any particular doping scheme.

The SRAM 100 also includes a first bias voltage contact ("first contact") 150 and a second bias voltage contact ("second contact") 160. As in the illustrated embodiment, the first and second contacts 150, 160 are part of a connecting circuit 170. However, the first and second contacts 150, 160 may be achieved by means other than the illustrated connecting circuit 170. For example, the first and second contacts 150, 160 may be bond pads, such as those typically formed as part of the interconnect layer 125 or the package 130.

Alternatively, the contacts 150, 160 may be embodied as a single bias contact selectably connectable to different power supplies. For example, if the well contact is brought out to a bond pad, the bond pad can then be connected to the chip supply voltage, $V_{dd}$, or the I/O buffer supply voltage, $V_{ddI/O}$. The well voltage can be selected by selecting alternate interconnect patterns. In any one pattern, the well is connected to one selected supply voltage.

In general, the first and second contacts 150, 160 are configured to bias the well 135 selectively with a first potential 180 or a second potential 185 that is greater than the first potential 180. In one embodiment, the first and second potentials 180, 185 may be first and second bias voltage buses. Those skilled in the art will recognize such bias of the well 135 as back-gate-bias or a channel bias. By selectively biasing the well 135 with one of the first and second potentials 180, 185, as described above, the threshold voltages of the SRAM device 100 are advantageously adjusted to overcome manufacturing fluctuations and improve yield.

For example, if it is determined that the SRAM device 100 has a weak second channel 147 (and/or a strong first channel 145), the source of first potential 180 may be connected to the well 135 to increase the $V_{trip}$ and write-operation reliability of the SRAM device 100. However, if it is determined that the SRAM device 100 has a strong second channel 147 (and/or a weak first channel 145), the source of second potential 185 may be connected to the well 135 to increase the SNM and read-operation reliability of the SRAM device 100.

In the illustrated embodiment, the first potential 180 is $V_{dd}$ for the device 100, and the second potential 185 is $V_{ddI/O}$ for the device 100. Accordingly, the source of first potential 180 is biased at about 1.2 volts and the source of second potential 185 is biased at about 1.8 volts. However, the first and second potentials 180, 185 are not limited to any specific values. Moreover, in one embodiment, the back-gate-bias may be selected from more than two potentials. Those skilled in the art will readily understand how a voltage divider may be advantageously integrated into existing SPAM devices or the SRAM device 100 to provide multiple back-gate-bias potentials from which a single potential may be selected to bias the well 135 most appropriately.

Determining the SNM and $V_{trip}$ of the channels 145, 147 may be accomplished by numerous means and at various stages of manufacture. For example, one or more transistors, such as those formed in the device layer 120, may be characterized by probing or otherwise accessing contacts (not shown) to determine conductivity, resistivity, gain, etc. In addition, one or more of the transistors may be characterized at an intermediate stage of manufacture, such as after the completion of the device layer 120 but before completion of the interconnect layer 125. Alternatively, or additionally, the transistors may be characterized by similarly accessing bond pads formed as part of the package 130.

In some tightly controlled manufacturing or assembly environments in which little variation is allowed to occur, only a small percentage of SRAM devices being manufactured may require testing. However, in other, less controlled, environments, a more significant percentage of lots, wafers, dies, circuits or individual SRAM devices may benefit from testing.

As discussed above, the connecting circuit 170 may take on any one of several different embodiments. In FIG. 1, the connecting circuit 170 is schematically depicted by a pair of switches or fuses 172, 174. While this embodiment certainly is operable, one of the switches or fuses 172, 174 must be rendered nonconductive so as not to short the first and second potentials 180, 185 together.

Figure 2A:
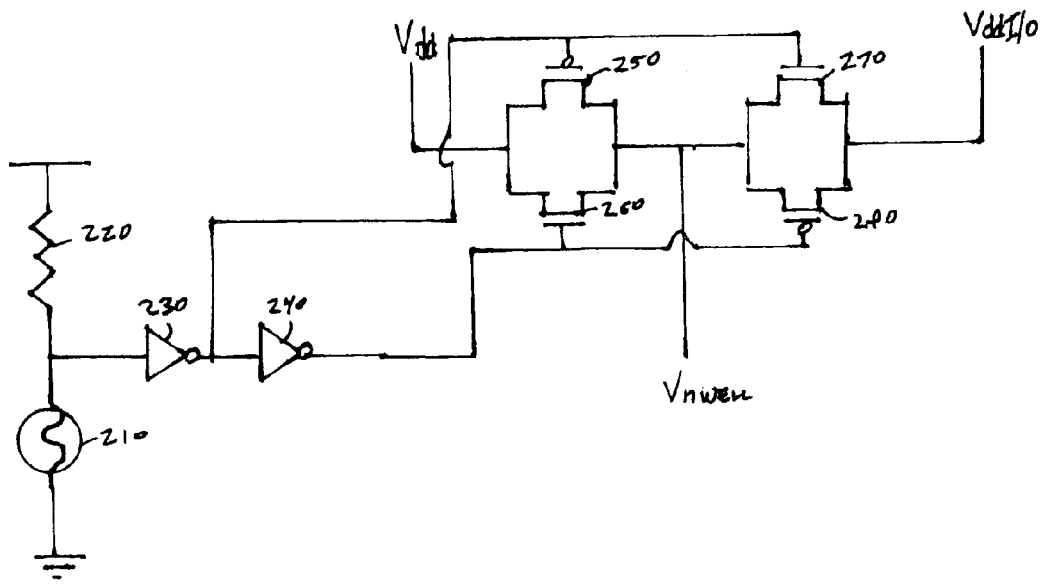
FIGS. 2A and 2B illustrate alternative implementations of a connecting circuit.
Figure 2B:
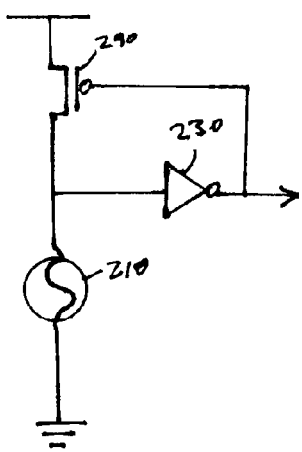

FIGS. 2A and 2B illustrate alternative, more practical implementations of the connecting circuit 170. In the embodiment of FIG. 2A, a single fuse 210, if made conductive, overwhelms a large resistor 220 and biases a first inverter 230 low and a second inverter 240 high. This, in turn, opens transistors 250, 260 and closes transistors 270, 280 thereby to select $V_{ddI/O}$ as the potential. If the single fuse 210 is made nonconductive, the resistor 220 biases the first inverter 230 high and the second inverter 240 low. This, in turn, closes the transistors 250, 260 and opens the transistors 270, 280 thereby to select $V_{dd}$ as the potential.

In FIG. 2B, the resistor 220 is replaced by a FET 290 driven by a feedback from the output of the first inverter 220. If the single fuse 210 is made conductive, the first inverter 220 is biased low, turning off the FET 290. If the single fuse 210 is made nonconductive, the first inverter 220 is biased high, turning on the FET 290 and thereby ensuring that the first inverter 220 remains biased high. The remainder of the connecting circuit 170 is as it was in FIG. 2A.

In yet another embodiment, the connecting circuit 170 comprises a conductor 176, such as those typically formed in the interconnect layer 125, that connects the well 135 to one of the first and second contacts 150, 160 (directly or indirectly). The connecting circuit 170 may also include one or more bond pads 178, such as those typically formed in the package 130, that connects the well 135 to one of the first and second contacts 150, 160 (directly or indirectly). In such embodiments, the SRAM device 100 may be substantially completed prior to performing the threshold voltage calibration process of the present invention. For example, the bond pads 178 may be employed to characterize the SNM and $V_{trip}$ of the SRAM device 100 and subsequently employed to connect one of the sources of first and second potential 180, 185 to the well 135. In one embodiment, the first and second contacts 150, 160 may comprise portions of the bond pad 178.

Figure 3:
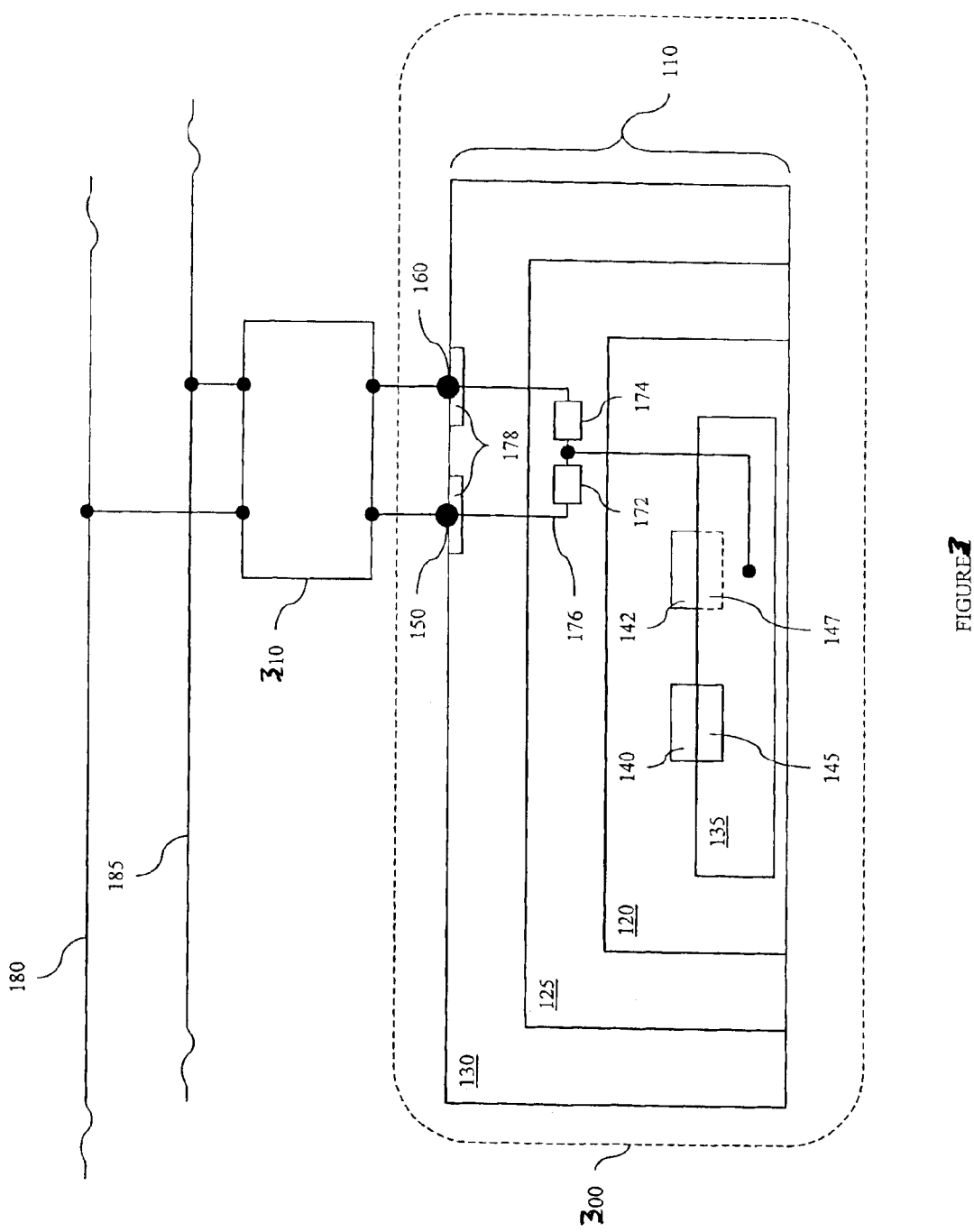
FIG. 3 illustrates a highly schematic diagram of another embodiment of an SRAM device constructed according to the principles of the present invention.

Turning now to FIG. 3, illustrated is a schematic diagram of another embodiment of an SRAM device 300 constructed according to the principles of the present invention. Reference numbers for features of the SRAM device 300 that correspond to features of the SRAM device 100 shown in FIG. 1 have been maintained in FIG. 3, where possible.

As in the embodiment illustrated in FIG. 3, the SRAM device 300 may be couplable to a switch 310 that connects the well 135 to one of the first and second contacts 150, 160. Accordingly, the switch 310 may selectively connect the well 135 to one of the sources of first and second potential 180, 185. The switch 310 may be driven by a built-in self test (BIST) system 320 implemented with the SRAM device 300. The BIST system 320 can be used to determine if failures occur on READ or WRITE and employ the switch 310 to adjust the well voltage accordingly.

Thus, the present invention presents an SRAM device having decreased sensitivity to variations in SNM and $V_{trip}$ of the memory array. Accordingly, acceptable SNM and $V_{trip}$ may be achieved despite the exigent manufacturing fluctuations stemming from continued downward scaling of SRAM devices. Consequently, read-and write-operations may be less affected by the fluctuations in transistor characteristics, and manufacturing yield may be increased.

Although the present invention has been described in detail, those skilled in the art should understand that they can make various changes, substitutions and alterations herein without departing from the spirit and scope of the invention in its broadest form.

What is claimed is:

1. A static random access memory device, comprising:
   a first bias voltage contact biasable to a first potential;
   a second bias voltage contact biasable to a second potential that differs from said first potential; and
   a well having channels formed therein and connected to one of said first and second bias voltage contacts based on a transistor characteristic of said SRAM device that bears on static noise margin and write trip voltage.

2. The device as recited in claim 1 further comprising a fuse circuit that connects said well to said one.

3. The device as recited in claim 1 further comprising a conductor in an interconnect layer of said device that connects said well to said one based on a position of said conductor.

4. The device as recited in claim 1 further comprising a bond pad that connects said well to said one.

5. The device as recited in claim 1 wherein said device is couplable to a switch that connects said well to said one.

6. The device as recited in claim 1 wherein said first potential is a chip supply voltage and said second potential is an input/output buffer supply voltage.

7. The device as recited in claim 1 wherein a built-in self test system determines said one.

8. A method of manufacturing a static random access memory device, comprising:
   providing a substrate;
   forming in said substrate a well having a first dopant type;
   forming in said well a transistor array including at least one channel having a second dopant type opposite said first dopant type;
   determining a transistor characteristic of said transistor array that bears on static noise margin and write trip voltage; and
   connecting said well to one of a first bias voltage contact biasable to a first potential or a second bias voltage contact biasable to a second potential based on said transistor characteristic.

9. The method as recited in claim 8 wherein said connecting comprises connecting said well to said one with a fuse circuit of said device.

10. The method as recited in claim 8 wherein said connecting comprises connecting said well to said one with a conductor in an interconnect layer of said device.

11. The method as recited in claim 8 wherein said connecting comprises connecting said well to said one with a bond pad of said device.

12. The method as recited in claim 8 wherein said connecting comprises connecting said well to said one with a switch coupled to said device.

13. The method as recited in claim 8 wherein said first potential is a chip supply voltage and said second potential is an input/output buffer supply voltage.

14. The method as recited in claim 8 further comprising determining said one with a built-in self test system.

15. A static random access memory device, comprising:
   a substrate;
   a well located in said substrate and having a first dopant type;
   a transistor array located in said well and including channels having a second dopant type opposite said first dopant type;
   a first bias voltage bus proximate said transistor array and biasable to a chip supply voltage; and
   a second bias voltage bus proximate said transistor array and biasable to an input/output buffer supply voltage that differs from said chip supply voltage, a well having channels formed therein and connected to one of said first and second bias voltage contacts based on a transistor characteristic of said transistor array that bears on static noise margin and write trip voltage.

16. The device as recited in claim 15 further comprising a fuse circuit that connects said well to said one.

17. The device as recited in claim 15 further comprising a conductor in an interconnect layer of said device that connects said well to said one.

18. The device as recited in claim 15 further comprising a bond pad that connects said well to said one.

19. The device as recited in claim 15 wherein said device is couplable to a switch that connects said well to said one.

* * * * *